(12) United States Patent
Seeley et al.

(10) Patent No.: US 7,852,105 B2
(45) Date of Patent: Dec. 14, 2010

(54) WINDING DIAGNOSTIC SYSTEM AND METHOD

(75) Inventors: Charles Erklin Seeley, Niskayuna, NY (US); Karim Younsi, Ballston Lake, NY (US); Sameh R. Salem, Rexford, NY (US); John Erik Hershey, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 87 days.

(21) Appl. No.: 12/328,840

(22) Filed: Dec. 5, 2008

(65) Prior Publication Data

US 2010/0141294 A1 Jun. 10, 2010

(51) Int. Cl.
*G01R 31/34* (2006.01)
(52) U.S. Cl. ...................................... 324/772
(58) Field of Classification Search ............... 324/158.1, 324/772, 538–554, 558–559; 310/214, 68
See application file for complete search history.

(56) References Cited

U.S. PATENT DOCUMENTS

| 5,012,684 A | 5/1991 | Humphries |
| 5,295,388 A | 3/1994 | Fischer et al. |
| 5,524,474 A | 6/1996 | Lavallee et al. |
| 7,112,909 B2* | 9/2006 | Swartout et al. ............ 310/214 |
| 7,117,754 B2* | 10/2006 | Neely et al. ............ 73/862.333 |
| 7,418,858 B2* | 9/2008 | Fischer et al. ................. 73/161 |
| 2008/0036336 A1* | 2/2008 | Salem et al. .............. 310/68 B |

* cited by examiner

*Primary Examiner*—Minh N Tang
*Assistant Examiner*—Trung Q Nguyen
(74) *Attorney, Agent, or Firm*—Ann M. Agosti

(57) ABSTRACT

A winding diagnostic system is provided. The system includes a core having a winding to generate a magnetic flux. A retention device for holding the winding in place is provided. The system further includes a sensor disposed in a sensing relation with the retention device to generate signals related to at least one aspect of the winding.

22 Claims, 5 Drawing Sheets

WINDING DIAGNOSTIC SYSTEM AND METHOD

BACKGROUND

The invention relates generally to electrical machines and in particular, to a winding retention monitoring mechanism.

Armature windings, also known as stator bar windings, are routinely inspected in electrical power generators, to verify their operation. In some generators, a stator yoke in the generator surrounds an armature core and partially encloses the armature windings. The stator windings are formed from a plurality of copper conductors that are wound in the armature to form loops. The armature windings may be arranged within a stator slot in such a manner that the generator may maintain desired voltage and current characteristics during operation.

Typically, a generator includes a wedge system to induce a radial retaining force to the stator from wedges to facilitate reducing movement of the stator bar windings within the stator slot. However, if the wedge system itself becomes loose, the amount of retaining force is reduced such that the stator bar windings may move during operation. Over time, the relative motion of the stator bar windings cause damage to insulation surrounding the stator bar wedges and a potential stator bar winding failure through electrical shorts to ground. Accordingly, within generators, the wedge system is periodically inspected to determine if any stator bar winding movement within the stator slots exceeds predetermined tolerances.

Currently, several known methods of assessing the status of a wedge system are used. A first known method uses a hardness tester to assess the relative looseness of the stator wedges. A second known method requires tapping each individual wedge and listening to the response to determine whether the wedges are loose. A third known method includes exciting the vibrational modes of the stator wedges using multiple impacts, and receiving the energy transmitted from the multiple impacts using a band-pass filter to determine whether the wedges are loose. However, the aforementioned methods for determining the tightness of the wedge require offline measurements while the generator is not operational and do not predict the onset of loose wedges.

There is a need for an improved winding and wedge monitoring system to predict an onset of looseness. The monitoring system may further include features such as detecting temperature and partial discharge in the windings to help in preventive maintenance.

BRIEF DESCRIPTION

Briefly, a winding diagnostic system is provided. The system includes a core having a winding to generate a magnetic flux. A retention device for holding the winding in place is provided. The system further includes a sensor disposed in a sensing relation with the retention device to generate signals related to at least one aspect of the winding.

In one embodiment, an apparatus to measure winding tightness in an electrical machine is provided. The apparatus includes a core comprising a stator winding to generate a magnetic flux. A ripple spring is provided for holding the stator winding in place. A piezoelectric sensor is embedded within the ripple spring. The piezoelectric sensor is configured to generate signals related to at least one aspect of the winding.

In one embodiment, a device to monitor winding is provided. The device includes a core comprising a winding to generate a magnetic flux. A retention device is provided for holding the winding in place. A sensor disposed in a sensing relation with the retention device to generate signals related to at least one aspect of the winding. The device further includes a wireless transmitter coupled to the sensor to transmit signals from the sensors.

In one embodiment, an apparatus to measure winding tightness in an electrical machine is presented. The apparatus includes a core comprising a stator winding to generate a magnetic flux and a ripple spring for holding the stator winding in place. At least two piezoelectric sensors are embedded within the ripple spring, wherein the piezoelectric sensors are configured to generate signals related to at least one aspect of the winding. The at least two piezoelectric sensors are coupled in a null configuration.

In one embodiment, a system to monitor and diagnose winging is provided. The system includes a core comprising a winding to generate a magnetic flux. A retention device is provided for holding the winding in place. A sensor is disposed in a sensing relation with the retention device to generate signals related to at least one aspect of the winding. An energy harvesting mechanism to generate operating power is coupled to the sensor and a wireless transmitter coupled to the sensor to transmit signals from the sensors.

In one embodiment, a method for measuring wedge tightness in an electromechanical device is provided. The method includes providing a ripple spring that holds a winding in place, positioning the ripple spring at least partially within a stator slot defined within the electromechanical device. The method further includes disposing a piezoelectric sensor within the ripple spring, generating signals from the piezoelectric sensor corresponding to at least one aspect of the winding and analyzing signals from the piezoelectric sensor to generate a fault signal.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
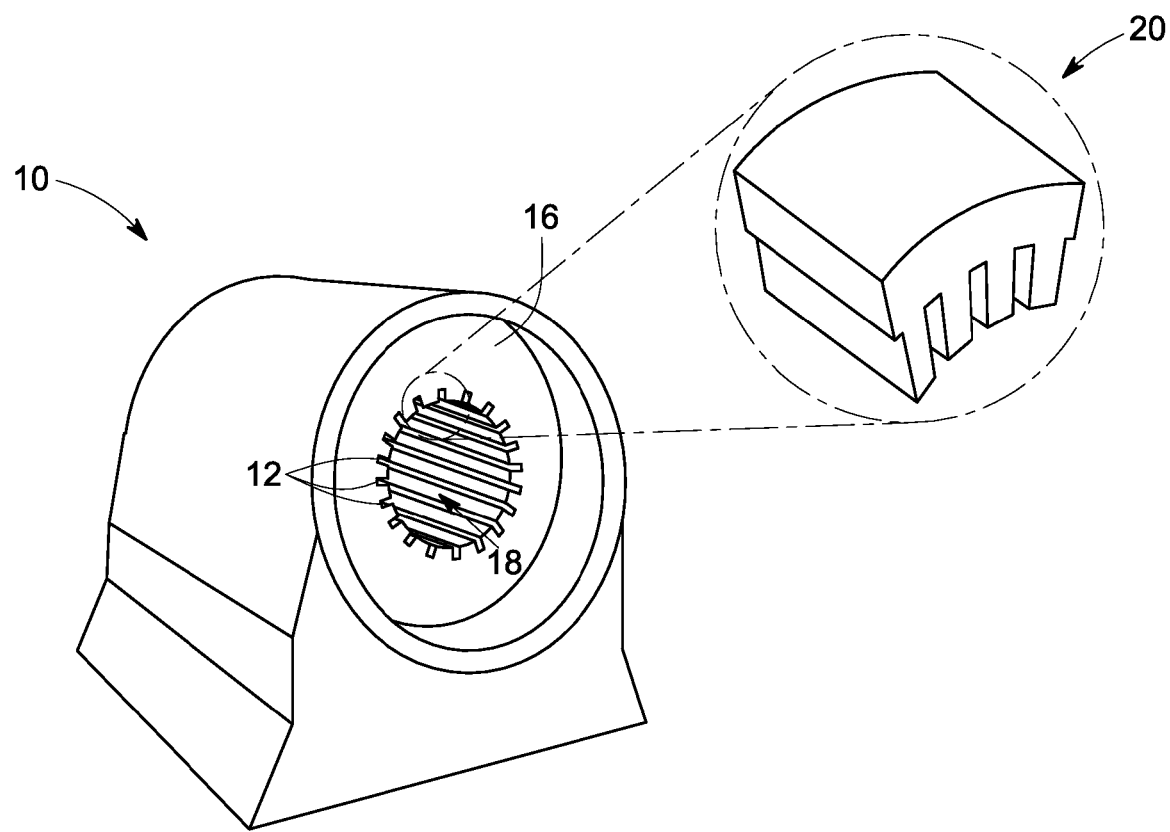
FIG. 1 is a perspective end view of an exemplary electric machine.

FIG. 1 is a perspective end view of an exemplary electric machine 10. The electrical machine 10 includes a core 16 having a plurality of stator slots 12 to accommodate a winding to generate a magnetic flux. The stator slots 12 are configured to accommodate stator windings to be positioned in the stator slots defined around an inner circumference of the core 16 (also referred to as the stator core). In the exemplary embodiment, stator bars windings are formed from a plurality of flat bar conductors or stator bars that are coupled together to form a pre-determined winding path. In one embodiment, the stator bars are fabricated from copper. A rotor (not shown) may be disposed within the stator core (18) defining an air gap between the stator windings and the rotor. An exploded view of the stator is illustrated by the reference numeral 20 that is described in detail in FIG. 2.

Figure 2:
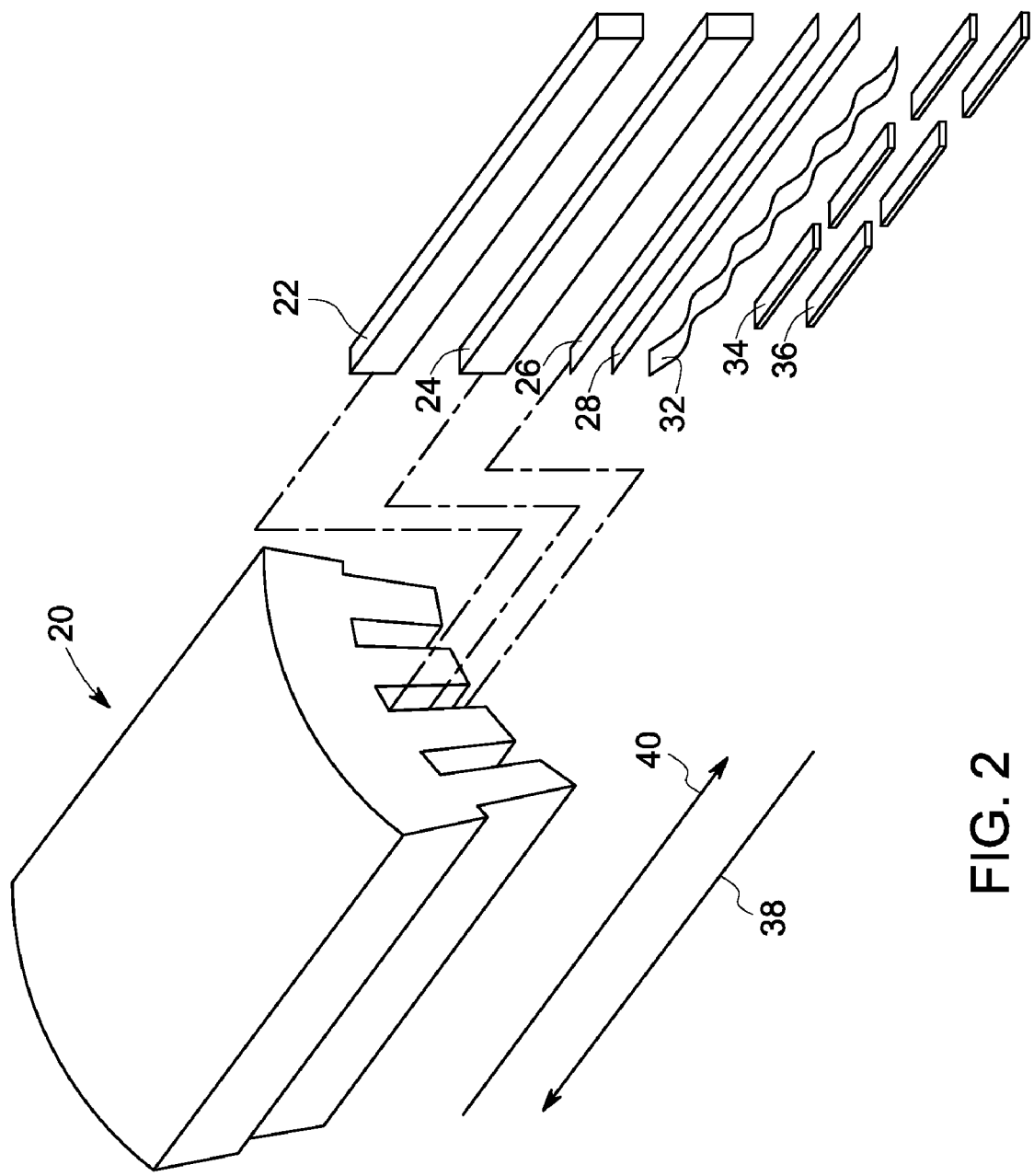
FIG. 2 is a partial exploded view of a portion of electric machine stator shown in FIG. 1.

FIG. 2 illustrates a partial exploded view of a portion of electric machine 10 of FIG. 1. In an exemplary embodiment, the stator 20 includes an outer stator bar winding 22, an inner stator bar winding 24, and one or more slot fillers 26, 28 are positioned at least partially within each stator slot 30. Wedge system including a retention device 32. In one embodiment, the retention device includes a ripple spring 32 that is positioned at least partially within stator slot 30 such that the ripple spring 32 is adjacent at to at least one of slot filler 26 or slot filler 28. The ripple spring 32 is then secured in stator slot 30 using a plurality of stator wedge slides 34 and stator wedges 36. For example, moving stator wedge slides 34 in a first direction, indicated by arrow 38, and with respect to stator wedges 36, or moving stator wedges 36 in a second direction, indicated by arrow 40, with respect to stator wedge slides 34, induces restraining pressure to outer stator bar 22 and inner stator bar 24 to facilitate securing outer stator bar 22 and inner stator bar 24 within stator slot 30.

Figure 3:
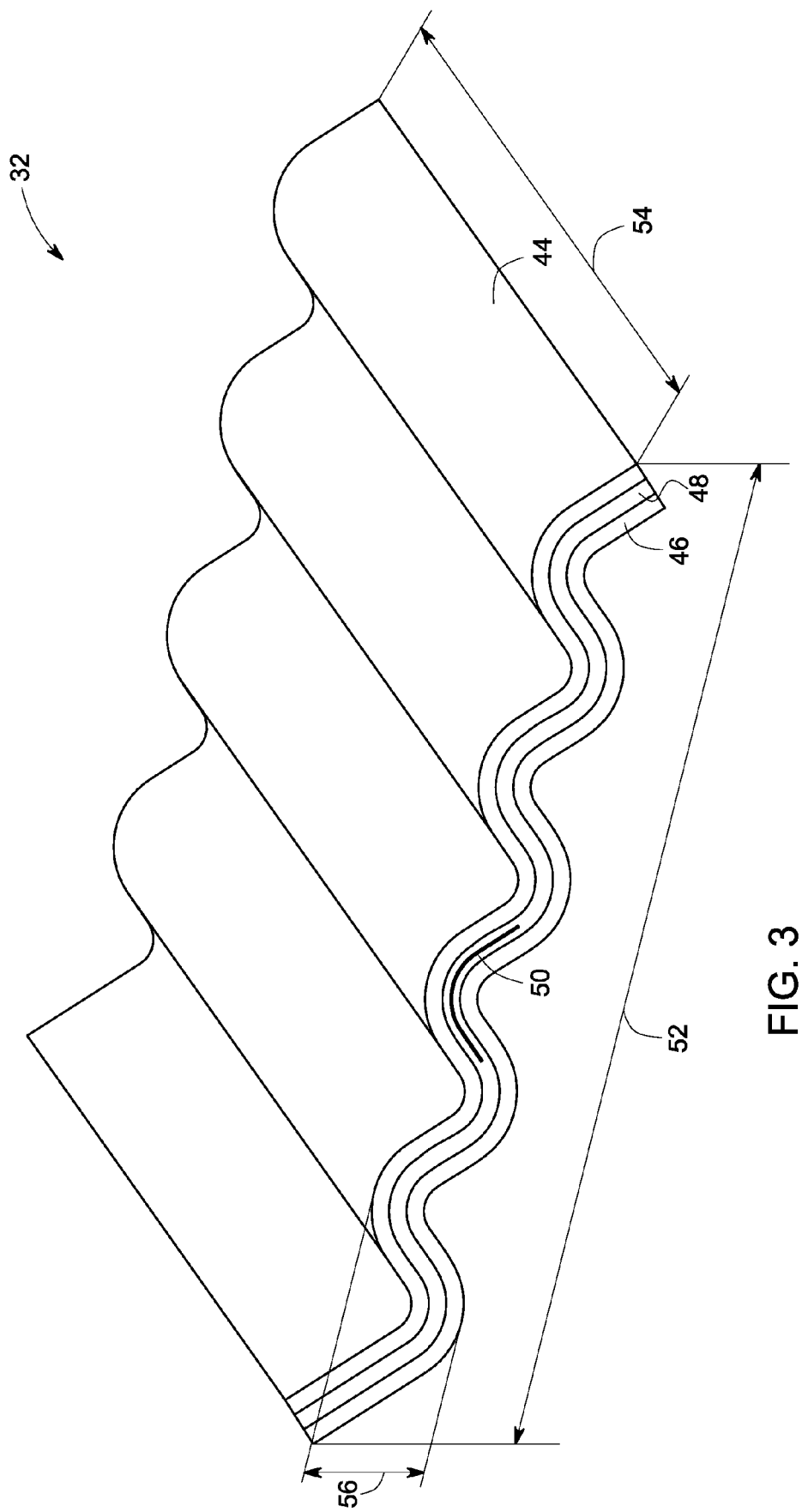
FIG. 3 is a side view of an exemplary ripple spring used within the electric machine of FIG. 1.

FIG. 3 is a side view of the ripple spring 32. In the exemplary embodiment, ripple spring 32 includes a top portion 44 and an oppositely disposed bottom portion 46 that extend substantially parallel to top portion 44. The ripple spring 32 also includes a middle portion 48 positioned between top portion 44 and bottom portion 46. In the exemplary embodiment, top portion 44, middle portion 48, and bottom portion 42 are fabricated from a non-conductive material such as, but not limited to, a plastic laminate. In one embodiment, a sensor 50 is disposed in a sensing relation with the ripple spring 32. In another embodiment, the sensor 50 is embedded into the middle portion 48. In an exemplary embodiment, the sensor 50 is a piezoelectric sensor. The sensor 50 may be bonded to a surface of the middle portion 48. The middle portion 48 has a cross-sectional profile that is substantially similar to the cross-sectional profile of top portion 44 and bottom portion 46 such that middle portion 48 substantially mates against top and bottom portion 44 and 46, respectively. Moreover, the ripple spring 32 has a length 52 and a width 54 that are variably selected depending on the size of stator slot 30 (shown in FIG. 2).

During use, the ripple spring 32, including the piezoelectric sensor 50, is positioned at least partially within stator slot 30, and stator wedges 36 are then inserted into stator slot 30 to induce a compression force on the ripple spring 32 (shown in FIG. 2). More specifically, stator wedges 36 are repositioned to facilitate compressing the ripple spring 32 substantially flat, at which time a full radial retaining force is achieved. For example, in the exemplary embodiment, when the ripple spring 32 is not compressed, i.e., the ripple spring 32 is relaxed, a thickness 56 of the ripple spring 32 is between approximately sixty millimeter (mm or one-thousandth of a meter) and approximately sixty-five mm. More specifically, the ripple spring 32 has an approximately thirty mm deflection when the ripple spring 32 is not compressed. However, when stator wedges 36 compress the ripple spring 32, the ripple spring 32 is compressed to a thickness 56 between approximately four mm and approximately six mm.

Accordingly, as the pressure on the ripple spring 32 is increased (or decreased) by repositioning wedges 36 within stator slot 30 and during an operation of the electrical machine 10, the thickness 56 of the ripple spring 32 changes across stator slot 30 in response to a vibration during operation or wedge pressure increase (or decrease). The ripple spring thickness 56, when either compressed or uncompressed, is both predictable and measurable via the piezoelectric sensor 50 configured to generate signals based on the mechanical boundary conditions that exists within the stator slot 30. A measuring instrument may be used to map a profile of the ripple spring 32. The measured profile is then used to determine the tightness of the stator winding within the stator slot 30.

In one embodiment, at least two piezoelectric sensors are embedded within the ripple spring. The piezoelectric sensors are configured to generate signals related to at least one aspect of the winding. The at least two piezoelectric sensors are coupled in a null configuration. The null configuration assists in canceling noise that may have coupled inductively from the large varying magnetic fields in the stator core.

The piezoelectric sensor 50 may profile at least one aspect of the stator winding. In one embodiment, an aspect of the stator winding such as the thickness 56 of the ripple spring 32 indicating the tightness of the stator winding (22, 24). In another embodiment, the piezoelectric sensor 50 may profile thermal characteristics of the ripple spring 32 indicating a temperature within the stator slot 30. In another embodiment, the piezoelectric sensor 50 may profile radio frequency characteristics of the ripple spring 32 indicating a partial discharge within the stator slot 30. A detailed description of the measuring instrument coupled to the ripple spring 32 to map the profile is provided in FIG. 4.

Figure 4:
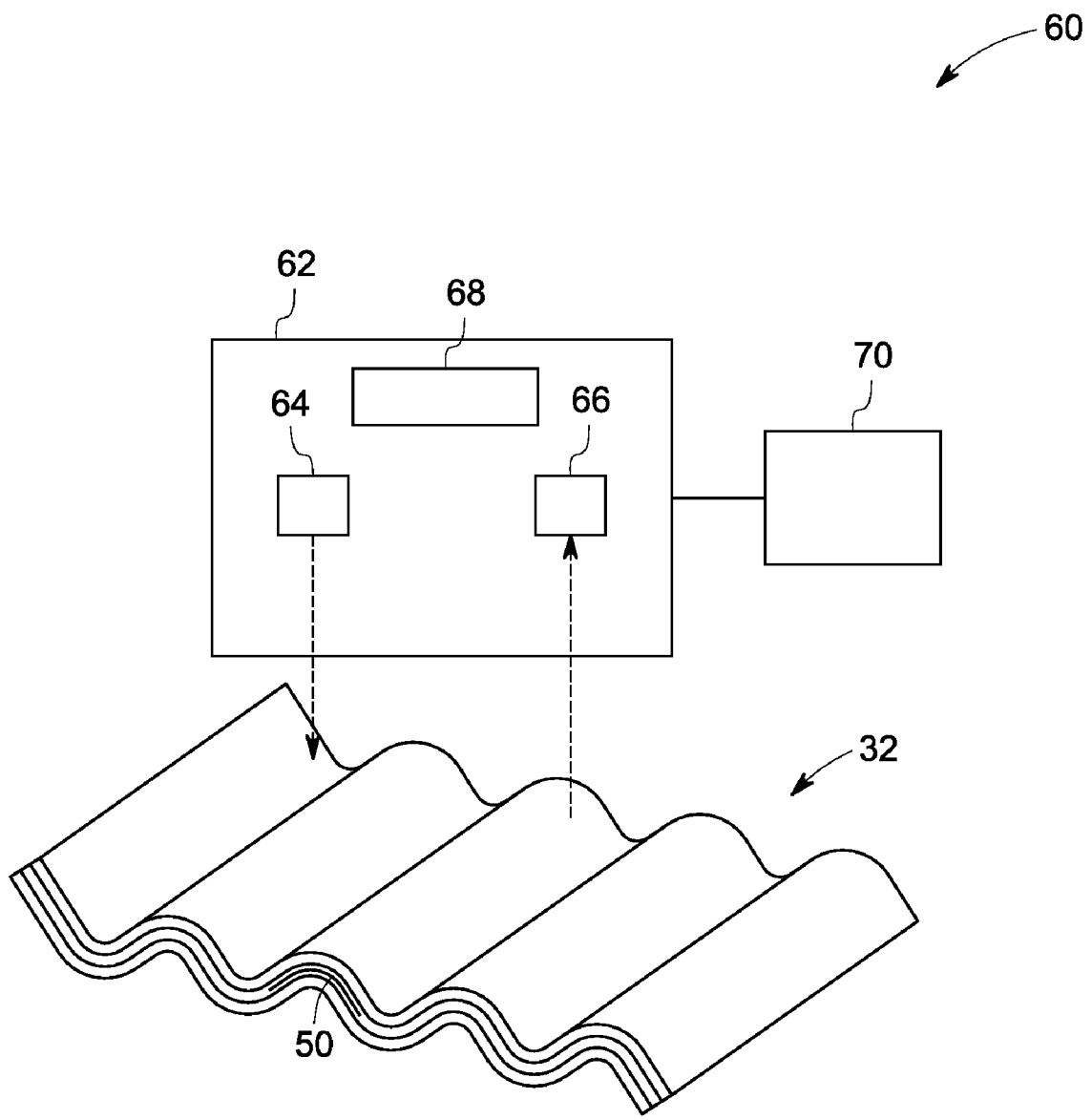
FIG. 4 is an exemplary measuring system implemented in electrical machine of FIG. 1.

FIG. 4 is an exemplary measuring system 60 that can be used to measure the stator winding (22, 24) tightness in an electromechanical device such as, but not limited to, electric machine 10 (shown in FIG. 1). Measuring system 60 includes a measuring apparatus 62. In the exemplary embodiment measuring apparatus 62 comprises a transmitter 64 and a receiver 66 coupled to the piezoelectric sensor 32. In one embodiment, measuring system 60 also includes a computer 70 configured to receive information from measuring apparatus 62 and to analyze data received from the piezoelectric sensor 50. In another embodiment, measuring apparatus 62 includes a power source 68 configured to supply power to the measuring apparatus 62 and the piezoelectric sensor 50. As used herein, the term computer is not limited to just those integrated circuits referred to in the art as computers, but broadly refers to computers, processors, microcontrollers, microcomputers, programmable logic controllers, application specific integrated circuits, and other programmable circuits.

In an exemplary embodiment, the power source 68 may include an energy harvesting mechanism that may generate power from the surrounding magnetic flux or vibrations in the electrical machine. Further, the transmitter 64 and the receiver 66 may include a wireless communication mode wherein physical connection is eliminated.

In operation, measuring system 60 is energized by the power source 68 such that energy is transmitted to the piezoelectric sensor 50. The measuring apparatus 62 is configured such that the receiver 66 receives a signal from the piezoelectric sensor 50. In the exemplary embodiment, the piezoelectric sensor 50 exhibits a change in current flow corresponding to change in mechanical conditions within the stator slot. Such change in current flow is proportional to an electrical impedance of the piezoelectric sensor 50. The receiver 66 is configured to measure the electrical impedance the piezoelectric sensor 50 within the stator slot 30. Change in the electrical impedance indicates a measure of the winding tightness. In one embodiment, transfer functions that relate the electrical impedance to the thickness or relaxation measurement of the ripple spring 32 are used to determine the winding tightness in the electromechanical device 10. In case of any deviation from a pre determined value for the winding tightness, a fault signal may be generated.

In another embodiment, measuring apparatus 62 receives the signals from the piezoelectric sensor 50 that are approximately proportional to the temperature within the stator slot 30. In another embodiment, measuring apparatus 62 receives the signals from the piezoelectric sensor 50 that are approximately proportional to the partial discharge within the stator slot 30. The ripple spring profile is then mapped using measuring apparatus 62, or computer 70 coupled to measuring apparatus 72 for example, to determine a thickness or relaxation of the ripple spring 32, or the temperature of the ripple spring 32, or the partial discharge activity within the ripple spring 32. Similarly, in the event of excessive temperature or abnormal partial discharge are detected, the fault signal may be generated. Such fault signal may be used to mitigate fault by way of a corrective measure such as shut down of the electrical machine 10. It may be noted that the fault signal helps in diagnostics and fault mitigation. A method implemented in the measuring system 60 is described in details of FIG. 5.

Figure 5:
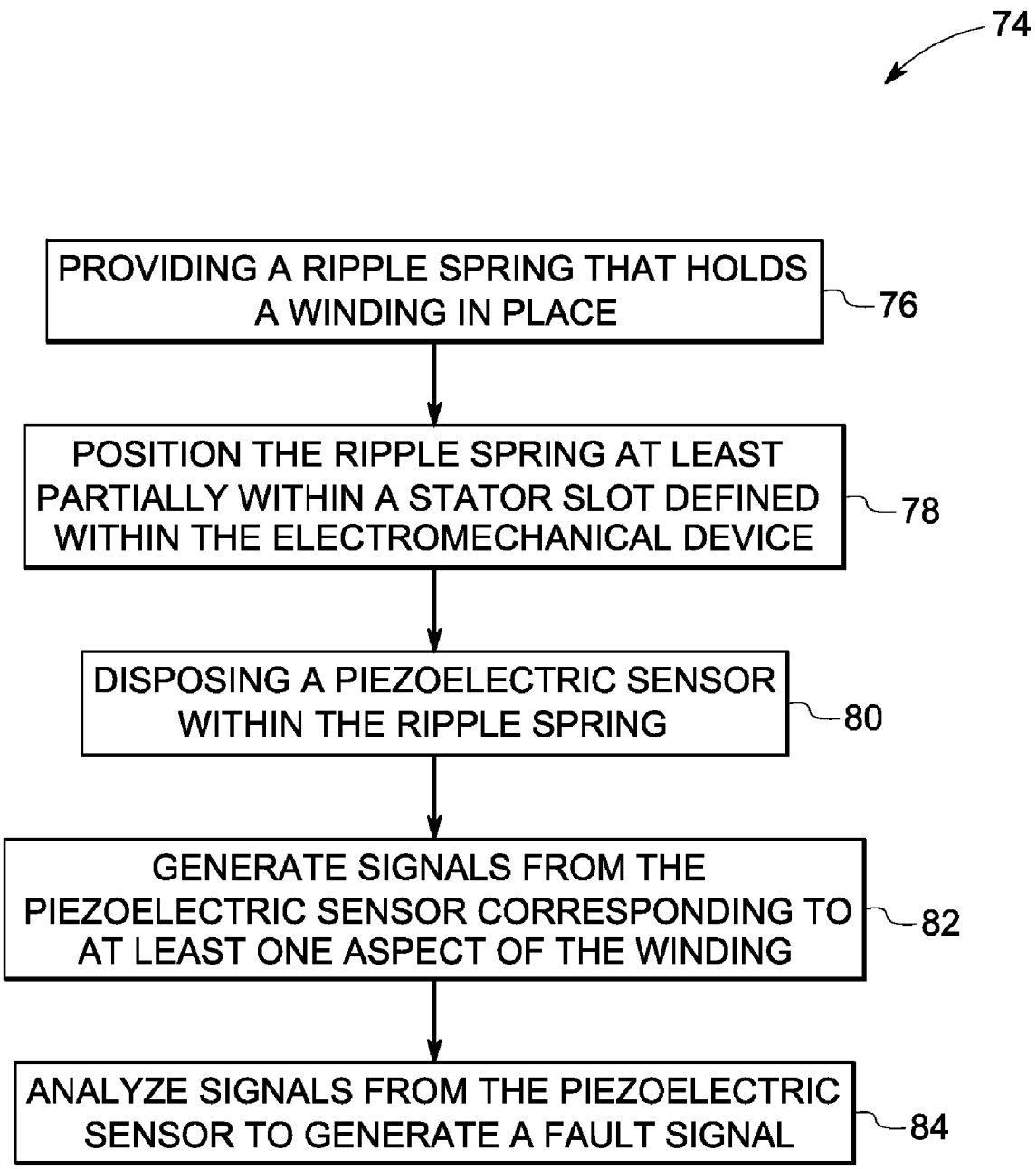
FIG. 5 is an exemplary method for monitoring winding tightness.

FIG. 5 is a flow chart of an exemplary method 74 for monitoring winding tightness. The method described herein assists an operator to easily inspect an electromechanical device winding system to determine the tightness of the winding system in the stator slot. Specifically, the methods described herein facilitate measuring the tightness of the wedges accurately when the ripple spring system is used during operation of the electromechanical device. The method 74 includes providing a ripple spring that holds a winding in place (76). The ripple spring is positioned at least partially within a stator slot defined within the electromechanical device (78). A piezoelectric sensor is disposed within the ripple spring (80). Signals are generated from the piezoelectric sensor corresponding to at least one aspect of the winding (82). The signals from the piezoelectric sensor are analyzed to generate a fault signal (84) that helps mitigate the fault.

Advantageously, the mapped profile can then be used by an operator to determine if the wedges need tightening, or estimate when the wedges will require tightening in the future. The electrical impedance measurements proposed herein are relatively easy to measure requiring minimum electrical components resulting in a low cost system. The sensor may be integrated into the ripple springs that hold stator components in place. The electronics could be integrated into the ripple spring as well, or placed outside the generator at the human interface providing flexibility to the measuring and diagnostic system.

Exemplary embodiments of wedge systems used in an electromechanical device are described above in detail. The components are not limited to the specific embodiments described herein, but rather, components of the wedge system may be utilized independently and separately from other components described herein. Specifically, the ripple spring described herein can also be used in combination with other wedge systems components installed in a plurality of electromechanical devices.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A winding diagnostic system comprising:
a core comprising a winding to generate a magnetic flux;
a retention device for holding the winding in place; and
a sensor disposed in a sensing relation with the retention device to generate signals related to at least one aspect of the winding, wherein the aspect of the winding comprises at least one of a temperature, a vibration and a partial discharge.
2. The system of claim 1, wherein the sensor comprises a piezoelectric sensor.
3. The system of claim 2, wherein the piezoelectric sensor is configured to generate signals corresponding to at least one of the winding.
4. The system of claim 1, wherein the sensor is embedded in to the retention device.
5. The system of claim 1, wherein the sensor is coupled to a diagnostic device.
6. The system of claim 5, wherein coupling is wireless.
7. The system of claim 5, wherein the diagnostic device generates a fault signal based up on signals from the sensors.
8. The system of claim 7, wherein the diagnostic device mitigating faults.
9. An apparatus to measure winding tightness in an electrical machine, the apparatus comprising:
a core comprising a stator winding to generate a magnetic flux;
a ripple spring for holding the stator winding in place; and
a piezoelectric sensor embedded within the ripple spring, wherein the piezoelectric sensor is configured to generate signals related to at least one aspect of the winding, wherein the aspect of the winding comprises at least one of a temperature, a vibration and a partial discharge.
10. A device to monitor winding comprising:
a core comprising a winding to generate a magnetic flux;
a retention device for holding the winding in place;
a sensor disposed in a sensing relation with the retention device to generate signals related to at least one aspect of the winding; and
a wireless transmitter coupled to the sensor to transmit signals from the sensors.
11. The device of claim 10, wherein the retention device comprises ripple spring.
12. The device of claim 10, wherein the core comprises teeth and slots, teeth configured to accommodate the winding.
13. The device of claim 10, wherein the sensor is embedded in to the retention device.
14. The device of claim 10, wherein the sensor comprises a piezoelectric sensor.
15. The device of claim 14, wherein the piezoelectric sensor comprises varying electrical impedance up on changing mechanical boundary conditions.
16. The device of claim 10 further comprising a measuring system to receive signals.
17. The device of claim 16, wherein the measuring system comprises generating a fault signal.
18. The device of claim 17, wherein the fault signal mitigates fault.
19. An apparatus to measure winding tightness in an electrical machine, the apparatus comprising:
a core comprising a stator winding to generate a magnetic flux;
a ripple spring for holding the stator winding in place; and
at least two piezoelectric sensors embedded within the ripple spring and coupled in a null configuration, wherein the piezoelectric sensors is configured to generate signals related to at least one aspect of the winding.

20. The apparatus of claim 19, wherein the null configuration is configured to cancel a varying magnetic field.

21. A system to monitor and diagnose winding, the system comprising:
   a core comprising a winding to generate a magnetic flux;
   a retention device for holding the winding in place; and
   a sensor disposed in a sensing relation with the retention device to generate signals related to at least one aspect of the winding;
   an energy harvesting mechanism to generate operating power coupled to the sensor; and
   a wireless transmitter coupled to the sensor to transmit signals from the sensors.

22. A method for measuring wedge tightness in an electromechanical device, said method comprising:
   providing a ripple spring that holds a winding in place;
   positioning the ripple spring at least partially within a stator slot defined within the electromechanical device;
   disposing a piezoelectric sensor within the ripple spring;
   generating signals from the piezoelectric sensor corresponding to at least one aspect of the winding; and
   analyzing signals from the piezoelectric sensor to generate a fault signal.

\* \* \* \* \*

UNITED STATES PATENT AND TRADEMARK OFFICE
CERTIFICATE OF CORRECTION

| | | |
|---|---|---|
| PATENT NO. | : 7,852,105 B2 | Page 1 of 1 |
| APPLICATION NO. | : 12/328840 | |
| DATED | : December 14, 2010 | |
| INVENTOR(S) | : Seeley et al. | |

It is certified that error appears in the above-identified patent and that said Letters Patent is hereby corrected as shown below:

In Column 3, Line 29, delete "42" and insert -- 46 --, therefor.

In Column 5, Line 13, delete "72" and insert -- 62 --, therefor.

In Column 6, Line 66, Claim 19, delete "is" and insert -- are --, therefor.

Signed and Sealed this
Seventh Day of June, 2011

David J. Kappos
*Director of the United States Patent and Trademark Office*